(12) United States Patent
Matsui

(10) Patent No.: US 6,477,102 B1
(45) Date of Patent: Nov. 5, 2002

(54) REDUNDANT PROGRAMMABLE CIRCUIT AND SEMICONDUCTOR MEMORY DEVICE HAVING THE SAME

(75) Inventor: Yuuji Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/599,798

(22) Filed: Jun. 22, 2000

(30) Foreign Application Priority Data

Jun. 24, 1999 (JP) .......................................... 11-178468

(51) Int. Cl.[7] .............................................. G11C 7/00
(52) U.S. Cl. .................... 365/225.7; 365/200; 365/210; 365/230.06
(58) Field of Search ............................. 365/225.7, 200

(56) References Cited

U.S. PATENT DOCUMENTS

| | | | | |
|---|---|---|---|---|
| 5,517,455 A | * | 5/1996 | McClure et al. | 365/225.7 |
| 5,696,723 A | * | 12/1997 | Tukahara | 365/200 |
| 5,812,466 A | * | 9/1998 | Lee et al. | 365/200 |
| 5,848,006 A | * | 12/1998 | Nagata | 365/230.06 |
| 5,959,907 A | * | 9/1999 | Kim et al. | 365/200 |
| 6,041,000 A | * | 3/2000 | McClure et al. | 365/200 |
| 6,061,291 A | * | 5/2000 | Zheng | 365/230.06 |
| 6,118,712 A | * | 9/2000 | Park et al. | 365/200 |
| 6,137,726 A | * | 10/2000 | Choi et al. | 365/185.24 |
| 6,163,860 A | * | 12/2000 | Merritt | 714/711 |

FOREIGN PATENT DOCUMENTS

| | | |
|---|---|---|
| JP | 5-74190 | 3/1993 |
| JP | 5-206752 | 8/1993 |
| JP | 7-98983 | 4/1995 |
| JP | 9-82094 | 3/1997 |
| JP | 10-55693 | 2/1998 |

* cited by examiner

Primary Examiner—David Nelms
Assistant Examiner—Connie C. Yoha

(57) ABSTRACT

In fuse blocks included in each of programmable circuits, an operational current of a fuse section is controlled by a current controller. In the fuse section, a diode-connected N-channel type MOS transistor is connected to an output line. In the fuse section, a diode-connected P-channel type MOS transistor is connected to an output line. A current flowing to and through the output lines is controlled by a P-channel type MOS transistor and an N-channel type MOS transistor included in the current controller.

15 Claims, 10 Drawing Sheets

REDUNDANT PROGRAMMABLE CIRCUIT AND SEMICONDUCTOR MEMORY DEVICE HAVING THE SAME

BACKGROUND OF THE INVENTION

1. Field of the Invention

The present invention relates to a semiconductor memory device having a redundant programmable circuit, and more particularly to a redundant programmable circuit which has a small chip area and can be operable while consuming little electric power, and also to a semiconductor memory device including the same.

2. Description of the Related Art

In order to improve the yield, some semiconductor memory devices include a spare memory cell (redundant memory cell) storing data for any defective memory cell (storage device). Such semiconductor memory devices include a redundant circuit for accessing the spare memory cell. The redundant circuit converts an address signal for requesting access to the defective memory cell into an address signal for accessing the spare memory cell.

Such a redundant circuit detects an address signal for requesting access to the defective memory cell, thus always needs to monitor any address signal sent from an external device to the semiconductor memory device. Hence, the redundant circuit, in general, includes a redundant programmable circuit having a fuse element.

FIG. 1 is a diagram showing an example of a conventional redundant programmable circuit. The redundant programmable circuit 160 shown in FIG. 1 stores data corresponding to one bit of an address signal, in accordance with an operational state of an inverter 166 and an N-channel type MOS transistor 168. The data which the redundant programmable circuit 160 stores is determined in accordance with whether a fuse element 162 is disconnected therefrom or not.

In the case where the fuse element 162 is disconnected therefrom, a voltage at the input terminal of the inverter 166 is a ground voltage, thus the inverter 166 outputs a high level voltage. As a result of this, the voltage output by an inverter 172 is at a low level, and the N-channel type MOS transistor 168 is in an ON state. In this case, a selection signal S is retained at a low level.

In the case where the fuse element 162 is not disconnected therefrom, an input voltage of the inverter 166 is determined based on a ratio of resistance of the fuse element 162 to resistance of a resistor 164. The resistance of the resistor 164 is, in general, sufficiently large, the input voltage of the inverter 166 is substantially at the same voltage level as that of a source voltage (VDD). Thus, the inverter 166 outputs a low level voltage. As a result of this, the voltage which the inverter 172 outputs is at a high level, and the N-channel type MOS transistor 168 is in an OFF state. In this case, the selection signal S is retained at a high level.

The resistors 164 and 170 are manufactured using high resistance polysilicon. Conventionally, a number of SRAM (Static Random Access Memory) cells included high resistance polysilicon. Therefore, the redundant programmable circuit 160 could be manufactured in the processes which are the same as those for manufacturing SRAM cells.

Of late, at the request for miniaturization and low-power-consumption of transistors, a source voltage driving the SRAM has gradually been decreased. If the source voltage decreases, the amount of current flowing through a high resistor included in each SRAM cell becomes decreases as well. The decrease in the current amount causes a low operational speed of the SRAM or deterioration in data storage characteristics of the memory cell.

In consideration of the above facts, in each SRAM cell, a CMOS circuit has begun to be utilized in place of high resistance polysilicon. If the CMOS circuit is employed in an SRAM cell, the manufacturing processes for forming, using high resistance polysilicon, the resistors 164 and 170 included in the redundant programmable circuit 160 can not be adapted for manufacturing the SRAM cells. If the resistance of the resistors 164 and 170 decreases, the electric power to be consumed dramatically increases. From the above reasons, an SRAM employing a CMOS circuit may possibly include the redundant programmable circuit 180 illustrated in FIG. 2.

For example, Unexamined Japanese Patent Application KOKAI Publication No. H10-55693 discloses a technique for improving operational characteristics of the redundant programmable circuit 180. The entire contents of this publication are incorporated herein by reference.

In the above case, two fuse elements are necessary for one bit address signal. As compared with any other devices, each fuse element needs a large area in a chip, resulting in increasing the chip area of the SRAM.

Unexamined Japanese Patent Application KOKAI Publication No. H7-98983 discloses a redundant controller which employs a circuit, wherein the resistor 164 is replaced with an N-channel type MOS transistor. The entire contents of this publication are incorporated herein by reference.

In the circuit disclosed in Unexamined Japanese Patent Application KOKAI Publication No. H7-98983, a source voltage is supplied to the gate electrode of an N-channel type MOS transistor, thus the amount of current flowing through transistors can not appropriately be controlled. Thus, the technique disclosed in Unexamined Japanese Patent Application KOKAI Publication No. H7-98983 may cause an increase in the electric power to be consumed.

SUMMARY OF THE INVENTION

It is accordingly an object of this invention to provided a circuit, which is small in size and requires a small amount of electric power, for detecting an address signal for requesting access to any defective memory cells.

In order to achieve the above-described object, according to the first aspect of the present invention, there is provided a redundant programmable circuit comprising:

a control signal generation circuit which has a fuse and generates a control signal in accordance with whether the fuse is disconnected; and a transfer gate which receives an address signal and outputs an inverted or non-inverted address signal in accordance with the control signal.

According to this invention, the control signal generation circuit has only one fuse, achieving the small chip area.

In this structure, a current controller which is connected to the control signal generation circuit controls an operational current to a given value. This can restrain the electric power to be consumed.

In order to achieve the above object, according to the second aspect of the present invention, there is provided a redundant programmable circuit, comprising:

a plurality of signal output circuits which are connected to a pair of connection lines, and each of which receives a binary signal corresponding to a plurality of bits sent from an external device, and also each of which outputs an inverted or non-inverted binary signal;

a coincidence detection circuit which generates a detection signal representing that the binary signals respectively output by the plurality of signal output circuits are at a predetermined signal level; and a current controller which controls an amount of current flowing to and through the pair of connection lines to a given value.

According to this invention, the current controller controls an amount of current flowing through the pair of connection lines at a given value. The pair of connection lines are parallelly connected to the plurality of signal output circuits. In this structure, an operational current of the plurality of signal output circuits can be controled, realizing operations of the signal output circuits with little electric power.

In the redundant programmable circuit, each of the plurality of signal output circuits may include:

a transistor and a fuse element which are connected in series between one of the pair of connection lines and a power source;

a voltage retaining circuit which receives a voltage at a connection point of the fuse element and the transistor, and outputs a signal at a given voltage level; and a transmission circuit which outputs the received binary signal in an inverted or non-inverted form, in accordance with a voltage level of the signal which the voltage retaining circuit outputs.

Since each of the plurality of signal output circuits includes a single fuse element, the chip area can be made small.

The voltage retaining circuit may output a signal at a given voltage level, which is determined in accordance with whether the fuse element is disconnected therefrom.

The binary signal which each of the plurality of signal output circuits receives may be a signal representing an address of a memory cell included in a semiconductor memory device.

The current controller may include a current mirror circuit; and the current controller may regulate an amount of current flowing through the pair of connection lines, based on an amount of current flowing through the current mirror circuit.

In order to achieve the above-described object, according to the third aspect of the present invention, there is provided a redundant programmable circuit comprising:

a plurality of signal output circuits, which are parallelly connected to a pair of connection lines, and each of which receives a binary signal corresponding to a plurality of bits sent from an external device, and also each of which outputs a binary signal in an inverted or non-inverted form;

a coincidence detection circuit which generates a detection signal representing that the binary signal output by each of the plurality of signal output circuits is at a given signal level; and a current controller which is connected the pair of connection lines and which controls an amount of current flowing to the plurality of signal output circuits to a given value.

According to this invention, the current controller is connected the pair of connection lines, and can control an amount of current flowing to the plurality of signal output circuits at a given value.

The current controller has a current mirror structure; and each of the plurality of signal output circuits may include a plurality of transistors which are current-mirror-connected with the current controller via the pair of connection lines.

Each of the plurality of signal output circuits may include:

a transistor whose gate electrode is connected to one of the pair of connection lines a fuse element which is connected in series with the transistor;

a voltage retaining circuit which receives a voltage at a connection point of the transistor and the fuse element, and outputs a signal at a given voltage level; and a transmission circuit which outputs the received binary signal in an inverted or non-inverted form, in accordance with a voltage level of a signal which the voltage retaining circuit outputs.

In this structure, each of the plurality of signal output circuits includes a single fuse element, thus the chip area can be made small.

The voltage retaining circuit may output a signal at a given voltage level which is determined in accordance with whether the fuse element is disconnected therefrom.

In order to achieve the above-described object, according to the fourth aspect of the present invention, there is provided a redundant programmable circuit comprising:

a plurality of signal output means for receiving a binary signal corresponding to a plurality of bits sent from an external device, and for outputting a binary signal in an inverted or non-inverted form;

means for generating a detection signal representing that the binary signal output by the plurality of signal output means is at a given signal level;

connection means for connecting the plurality of signal output means; and current controlling means for controlling an amount of current flowing through the plurality of signal output means to a given value.

In order to achieve the above-described object, according to the fifth aspect of the present invention, there is provided a semiconductor memory device comprising:

a memory cell array;

a redundant memory cell array;

a first driving circuit, which receives an address signal, for accessing a memory cell included in the memory cell array a redundant programmable circuit which receives an address signal and which determines whether the received address signal is one for requesting access to any defective memory cell; and a second driving circuit for accessing a memory cell included in the redundant memory cell array, when the redundant programmable circuit detects an request for accessing a defective memory cell, and wherein the redundant programmable circuit, receives a binary signal forming an address signal corresponding to a plurality of bits, and includes a plurality of signal output circuits each of which outputs a binary signal in an inverted or non-inverted form, a coincidence detection circuit which generates a detection signal representing that the binary signal output by each of the plurality of signal output circuits is at a given signal level, and a current controller which controls an amount of current flowing through the plurality of signal output circuits to a given value.

Each of the plurality of signal output circuits may include:
a transistor and a fuse element which are connected in series between a power source and the connection lines connected to the current controller;
a voltage retaining circuit which receives a voltage at a connection point of the transistor and the fuse element, so as to output a signal at a given voltage level; and
a transmission circuit which outputs the received binary signal in an inverted or non-inverted form, in accordance with a voltage level of the signal output by the voltage retaining circuit.

The voltage retaining circuit may output a signal at a given voltage level which is determined in accordance with whether the fuse element is disconnected.

The current controller may include a current mirror circuit; and
the current controller may regulate an amount of current flowing through the plurality of signal output circuits, based on an amount of current flowing to the current mirror circuit.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENT

Figure 1:
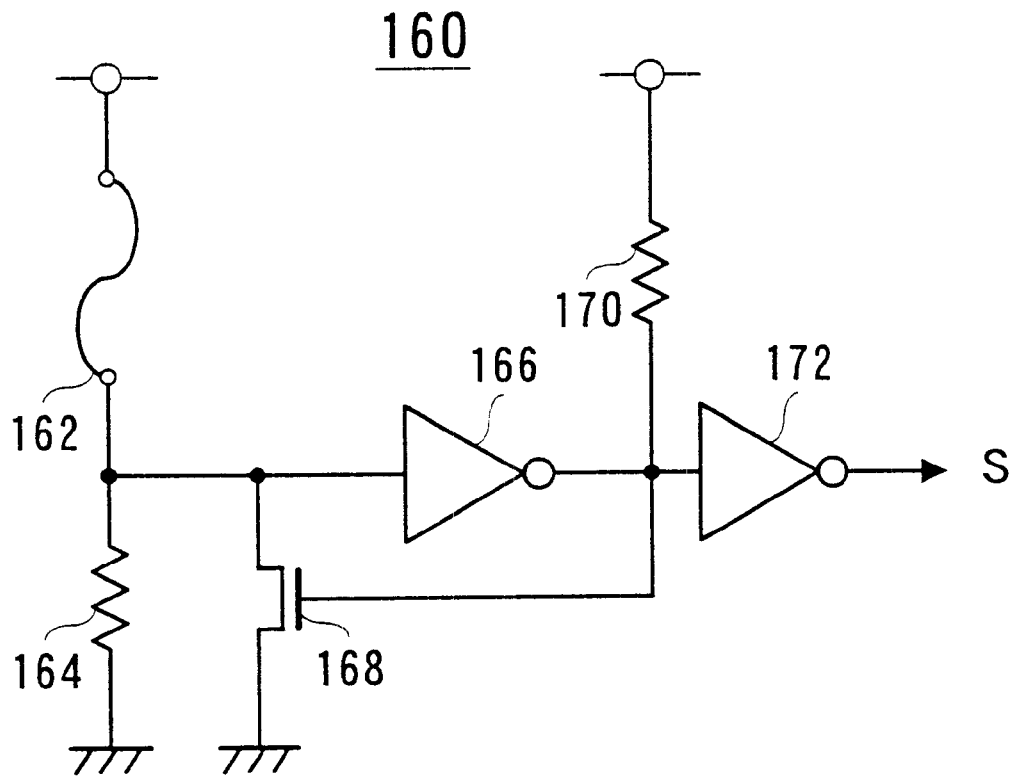
FIG. 1 is a diagram showing one example of a conventional redundant programmable circuit.
Figure 2:
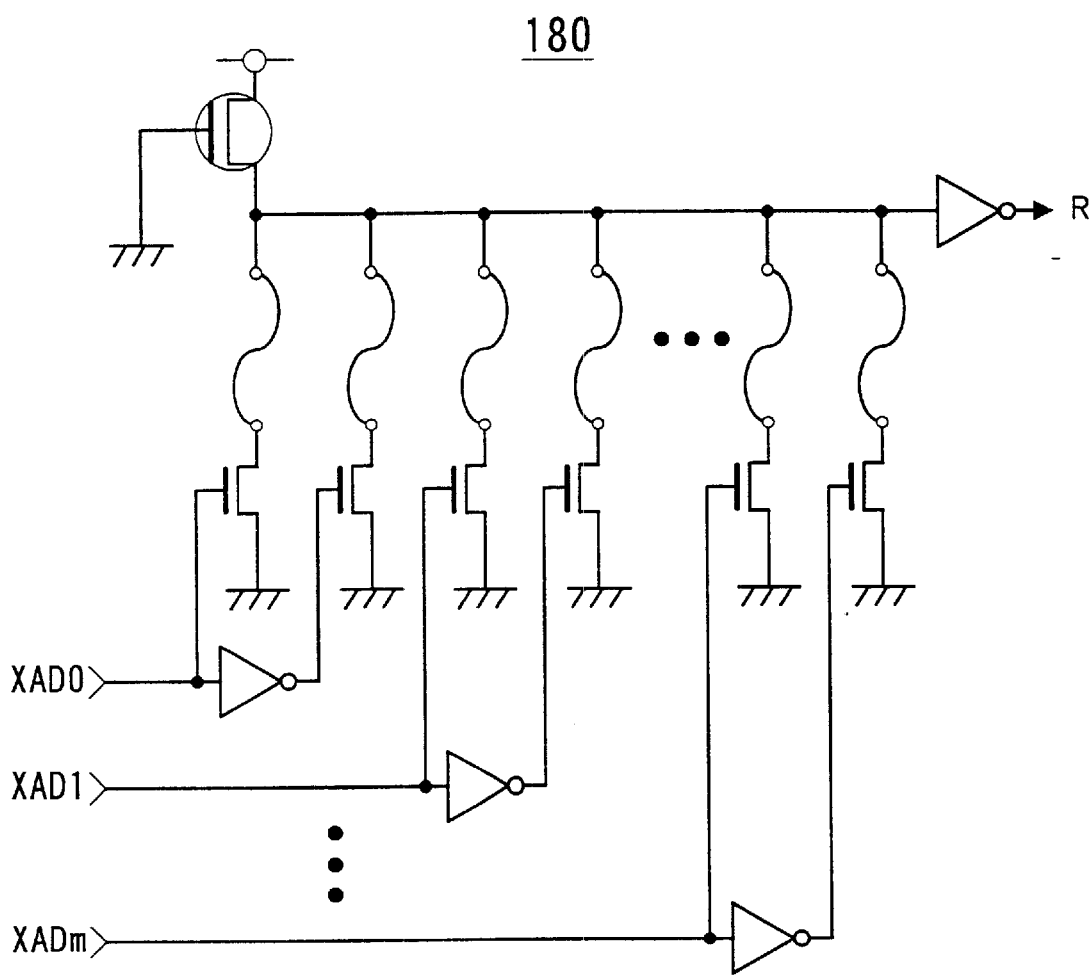
FIG. 2 is a diagram showing one example of a conventional redundant programmable circuit which is adapted in an SRAM cell employing a CMOS circuit.
Figure 3:
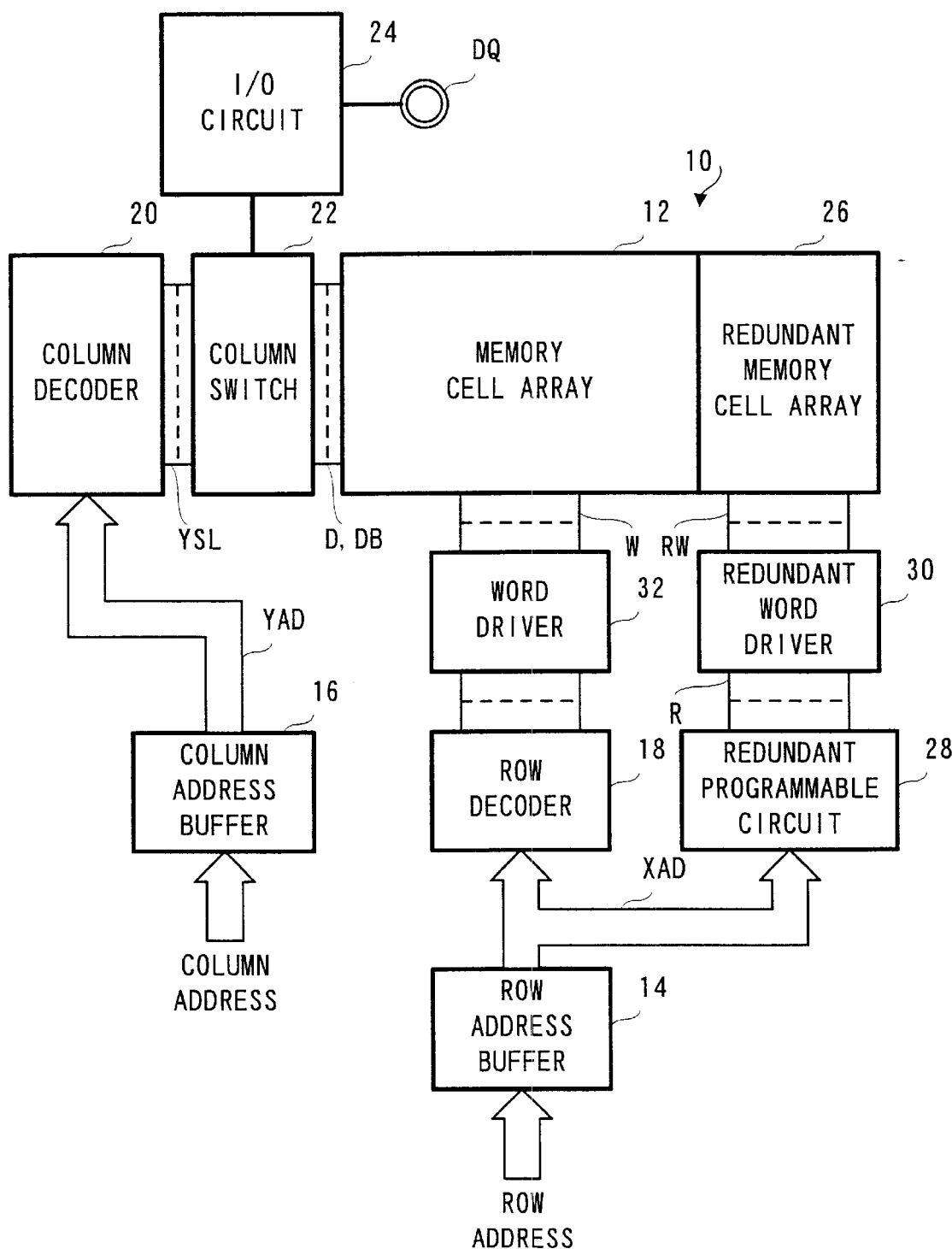
FIG. 3 is a diagram showing the structure of a semiconductor memory device according to an embodiment of the present invention.

Embodiments of the present invention will now be explained with reference to the accompanying drawings. FIG. 3 is a block diagram showing the structure of a semiconductor memory device 10 having a redundant programmable circuit according to the first embodiment of the present invention.

As shown in FIG. 3, the semiconductor memory device 10 comprises a memory cell array 12, a row address buffer 14, a column address buffer 16, a row decoder 18, a column decoder 20, a column switch 22, an I/O circuit 24, a redundant memory cell array 26, a redundant programmable circuit 28, a redundant word driver 30, and a word driver 32.

Figure 4:
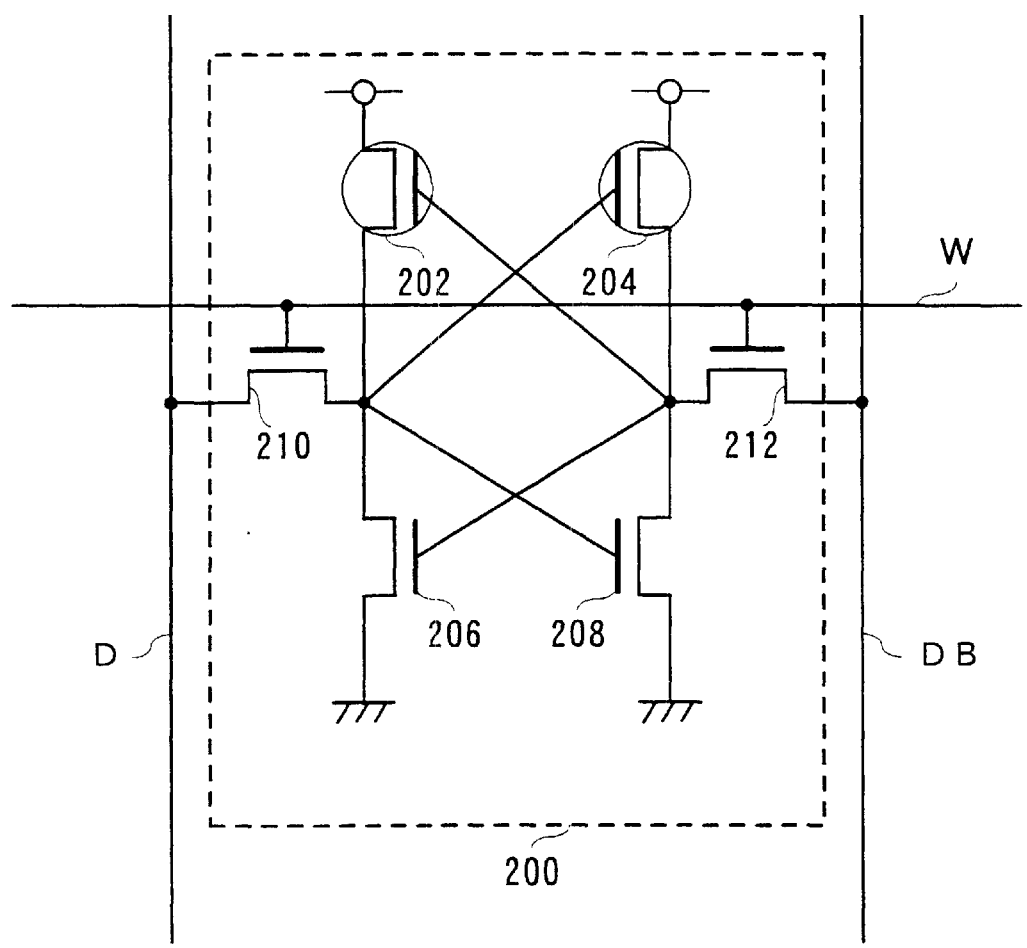
FIG. 4 is a diagram exemplarily showing the structure of an SRAM cell.

Each of the memory cell array 12 and the redundant memory cell array 26 includes an SRAM cell 200 employing CMOS circuits shown in FIG. 4. The SRAM cell 200 is arranged between an intersection of a word line W and a digit line D and an intersection of the word line W and a digit line DB. The SRAM cell 200 comprises N-channel type MOS transistors 206 to 212, and P-channel type MOS transistors 202 and 204. When the voltage applied to the word line W is at a high level, the N-channel type MOS transistors 210 and 212 electrically connect the N-channel type MOS transistors 206 and 208 respectively with the pair of digit lines D and DB. At this time, data stored in the SRAM 200 is transmitted to the pair of digit lines D and DB (reading). Otherwise, the data stored in the SRAM 200 can be updated by the voltage supplied by the pair of digit lines D and DB (writing).

Figure 5:
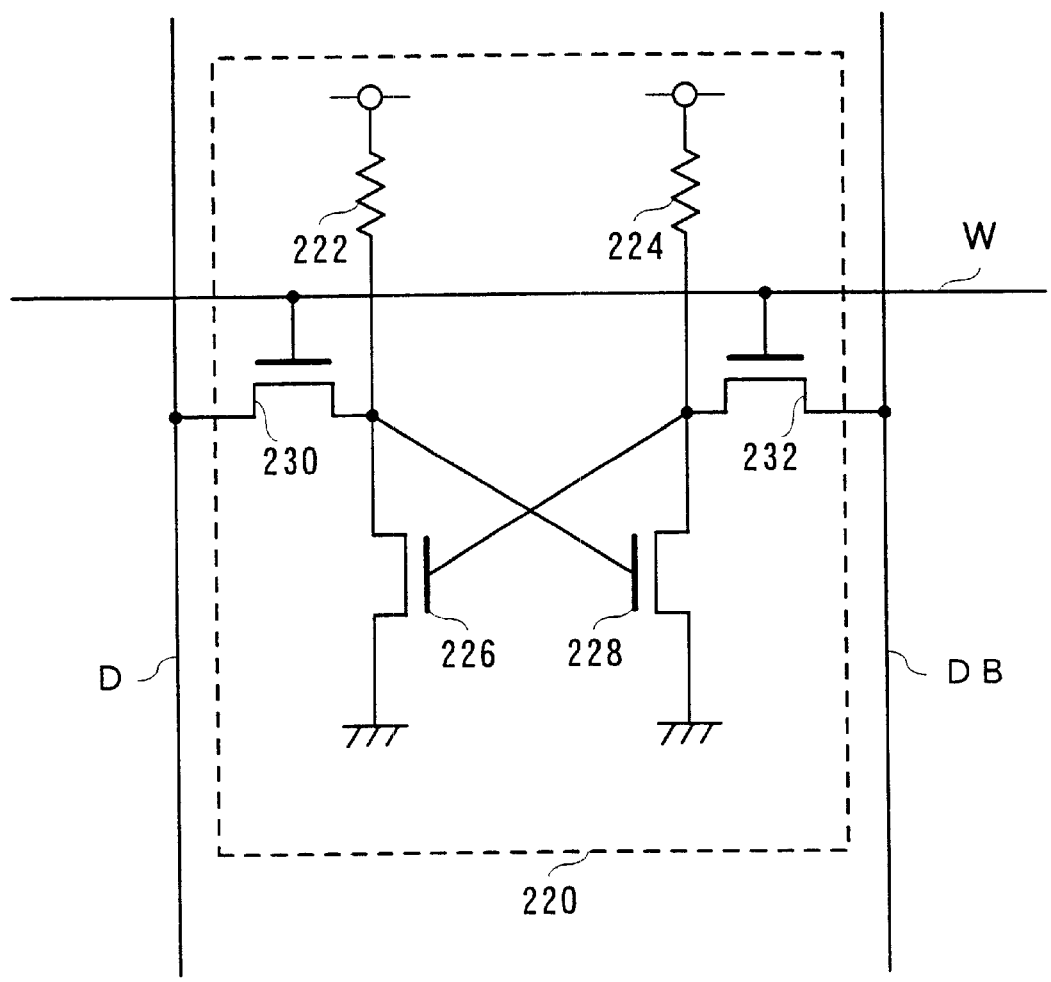
FIG. 5 is a diagram exemplarily showing the structure of an SRAM cell.

In place of the SRAM cell 200, an SRAM cell 220 shown in FIG. 5 may be employed. The SARM cell 220 comprises N-channel type MOS transistors 226 to 232 and resistors 222 and 224 whose resistance values are large (approximately, a few tera-[$\times 10^{12}$] Ohms). The resistors 222 and 224 are manufactured utilizing high resistance polysilicon.

The memory cell array 12 and the redundant memory cell array 26 may each include a TFT-type SRAM, a DRAM (Dynamic Random Access Memory), an FRAM (Ferroelectric Random Access Memory), etc.

The row address buffer 14 receives an externally-sent address signal representing a row address of the memory cell array 12. The row address buffer 14 buffers the received address signal, and supplies the row decoder 18 and the redundant programmable circuit 28 with the address signal as an internal row address XAD.

The column address buffer 16 receives an externally-sent address signal sent representing a column address of the memory cell array 12. The column address buffer 16 buffers the received address signal, and supplies the column decoder 20 with the address signal as an internal column address YAD.

The row decoder 18 decodes the internal row address XAD which has been supplied by the row address buffer 14. The address data decoded by the row decoder 18 is sent to the word driver 32. The word driver 32 applies a high level voltage to, of a plurality of word lines W, one word line W corresponding to the address data.

The column decoder 20 decodes the internal column address YAD which is supplied by the column address buffer 16. The column decoder 20 applies a voltage to a column selection line YSL corresponding to a decoding result of the internal column address YAD, thereby to supply the column switch 22 with a column selection signal.

The column switch 22 selects the pair of digit lines D and DB in accordance with the column selection signal supplied by the column decoder 20. The pair of digit lines D and DB selected by the column switch 22 are electrically connected to the I/O circuit 24.

The I/O circuit 24 is connected to a data I/O terminal DQ. The I/O circuit 24 outputs to the data I/O terminal DQ a voltage of the pair of digit lines D and DB which are electrically connected to the YO circuit 24 by the column switch 22, when reading out data stored in this semiconductor memory device 10. The I/O circuit 24 applies a voltage sent from the data I/O terminal DQ to the pair of digit lines D and DB which are electrically connected to the I/O circuit 24 by the column switch 22, when writing data into this semiconductor memory device 10.

The redundant programmable circuit 28 generates a detection signal R representing whether the internal row address XAD sent by the row address buffer 14 is an address of a defective cell.

Figure 6:
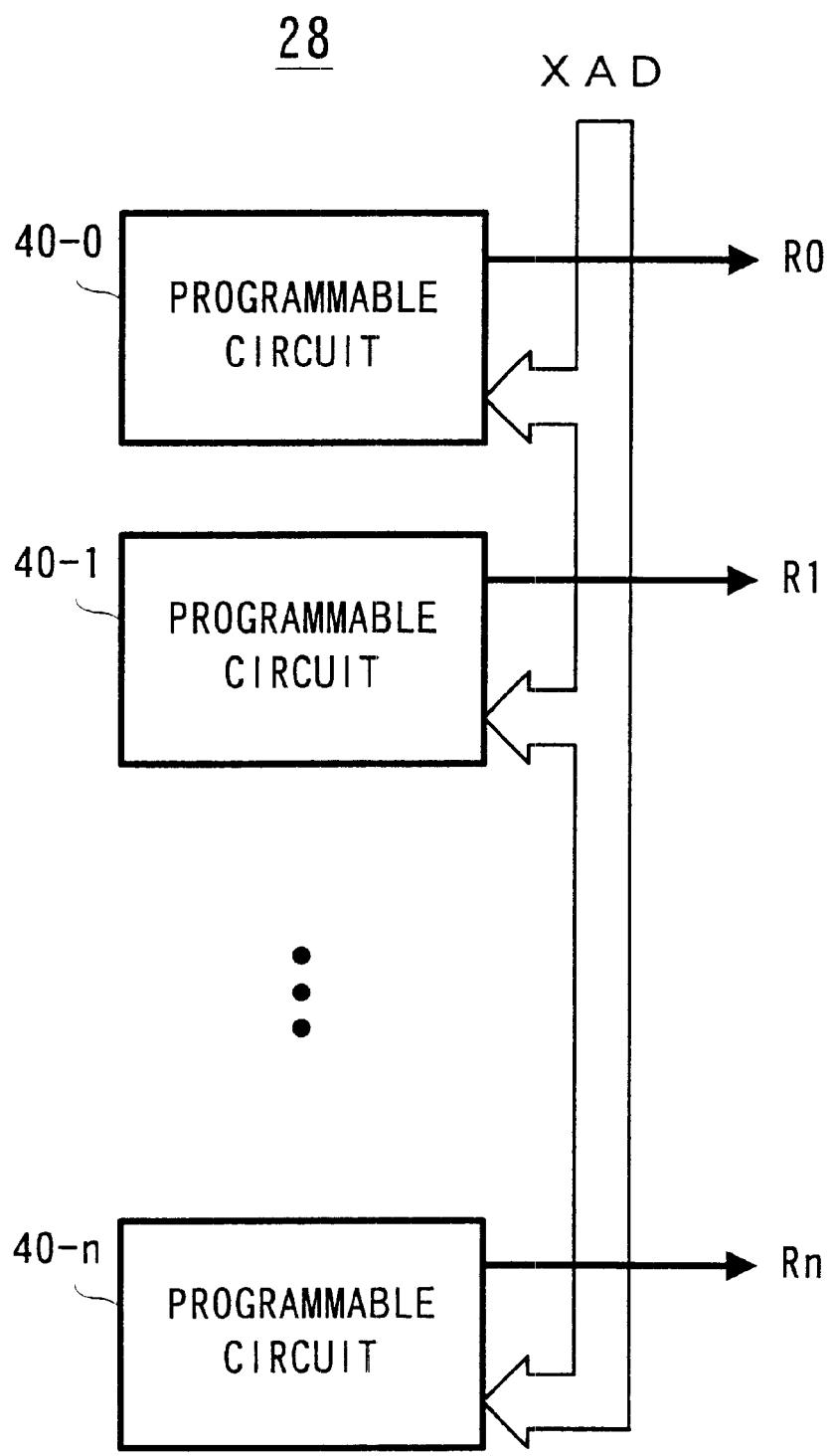
FIG. 6 is a diagram showing the structure of a redundant programmable circuit.

As illustrated in FIG. 6, the redundant programmable circuit 28 includes an "n+1" number of programmable circuits 40-0 to 40-n which are connected in parallel with each other. The programmable circuits 40-1 to 40-n respectively receive internal row addresses XAD.

Stored in each of the programmable circuits 40-0 to 40-n is a row address of a defective memory cell included in the memory cell array 12. The programmable circuits 40-0 to 40-n respectively set detection signals R0 to Rn at a high level, when the internal row addresses XAD sent from the row address buffer 14 respectively coincide with row addresses stored therein. That is, the redundant programmable circuit 28 can store an "n+1" number of addresses of defective memory cells.

Figure 7:
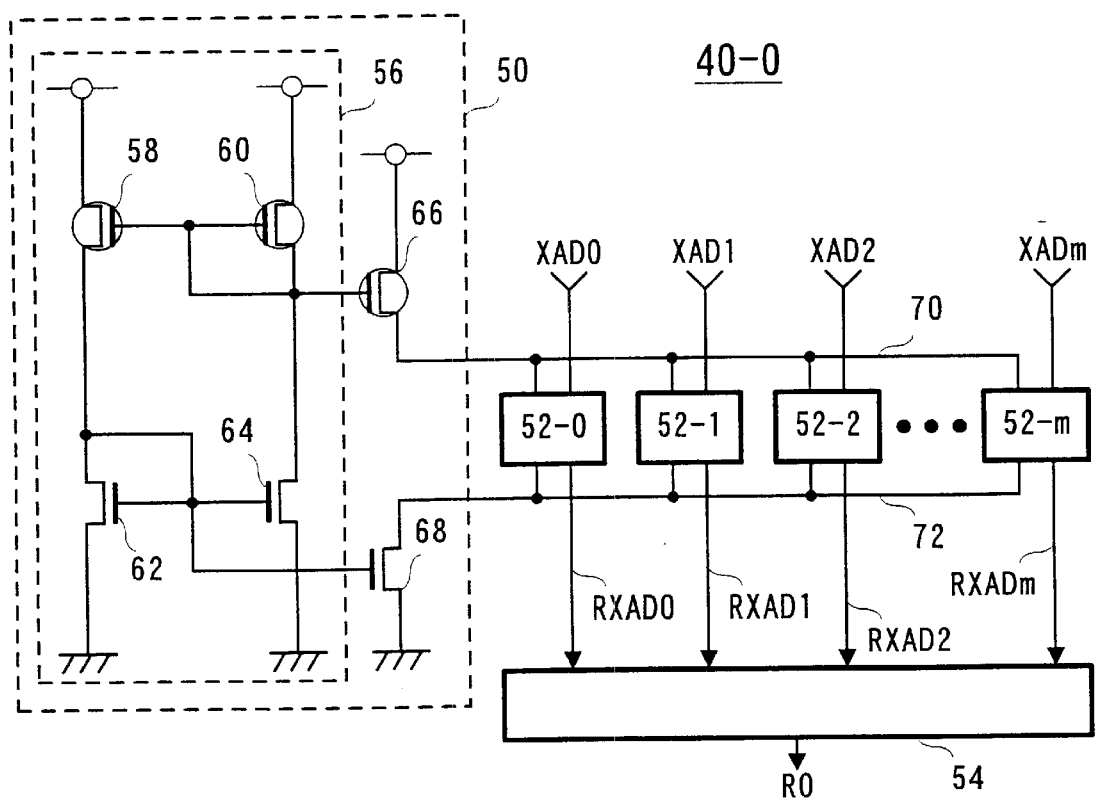
FIG. 7 is a diagram showing the structure of a programmable circuit according to the first embodiment of the present invention.

FIG. 7 is a diagram showing the circuitry structure of the programmable circuit 40-0. The rest of programmable circuits 40-1 to 40-n have the same structure.

As described in FIG. 7, the programmable circuit 40-0 comprises a current controller 50, a plurality of fuse blocks 52-0 to 52-m and a coincidence detection circuit 54.

The current controller 50 is a circuit having the current mirror structure. Particularly, the current controller 50 comprises a current mirror section 56, a P-channel type MOS transistor 66 and an N-channel type MOS transistor 68.

The current mirror section 56 includes P-channel type MOS transistors 58 and 60 and N-channel type MOS transistors 62 and 64. The gate electrode of the P-channel type MOS transistor 58 and the gate electrode of the P-channel type MOS transistor 60 are commonly connected to the drain of the P-channel type MOS transistor 60 and the gate electrode of the P-channel type MOS transistor 66. The gate electrode of the N-channel type MOS transistor 62 and the gate electrode of the N-channel type MOS transistor 64 are connected to the drain of the N-channel type MOS transistor 62 and the gate electrode of the N-channel type MOS transistor 68. A source voltage (VDD) is supplied to each source of the respective P-channel type MOS transistors 58, 60 and 66. The sources of the P-channel type transistors 62, 64 and 68 are connected to ground (GND). The drain of the P-channel type MOS transistor 66 is connected to an output line 70, and supplies the output line 70 with a driving voltage. The drain of the N-channel type MOS transistor 68 is connected to an output line 72, and supplies the output line 72 with a driving voltage.

Unexamined Japanese Patent Application KOKAI Publication No. H9-82094 discloses a circuit having the structure similar to that of the current controller 50. The entire disclosure of this publication is incorporated herein by reference.

The number of fuse blocks 52-0 to 52-m, which is the same as the bit number of the internal row address XAD, are prepared in each one of the "n+1" number of programmable circuits 40-0 to 40-n. The plurality of fuse blocks 52-0 to 52-m are connected to both the output lines 70 and 72 which are connected to the current controller 50. Each of the fuse blocks 52-0 to 52-m receives a corresponding one bit of bits XAD0 to XADm of the internal row address XAD. The plurality of fuse blocks 52-0 to 52-m respectively output redundant address signals RXAD0 to RXADm, and send the signals to the coincidence detection circuit 54.

Figure 8:
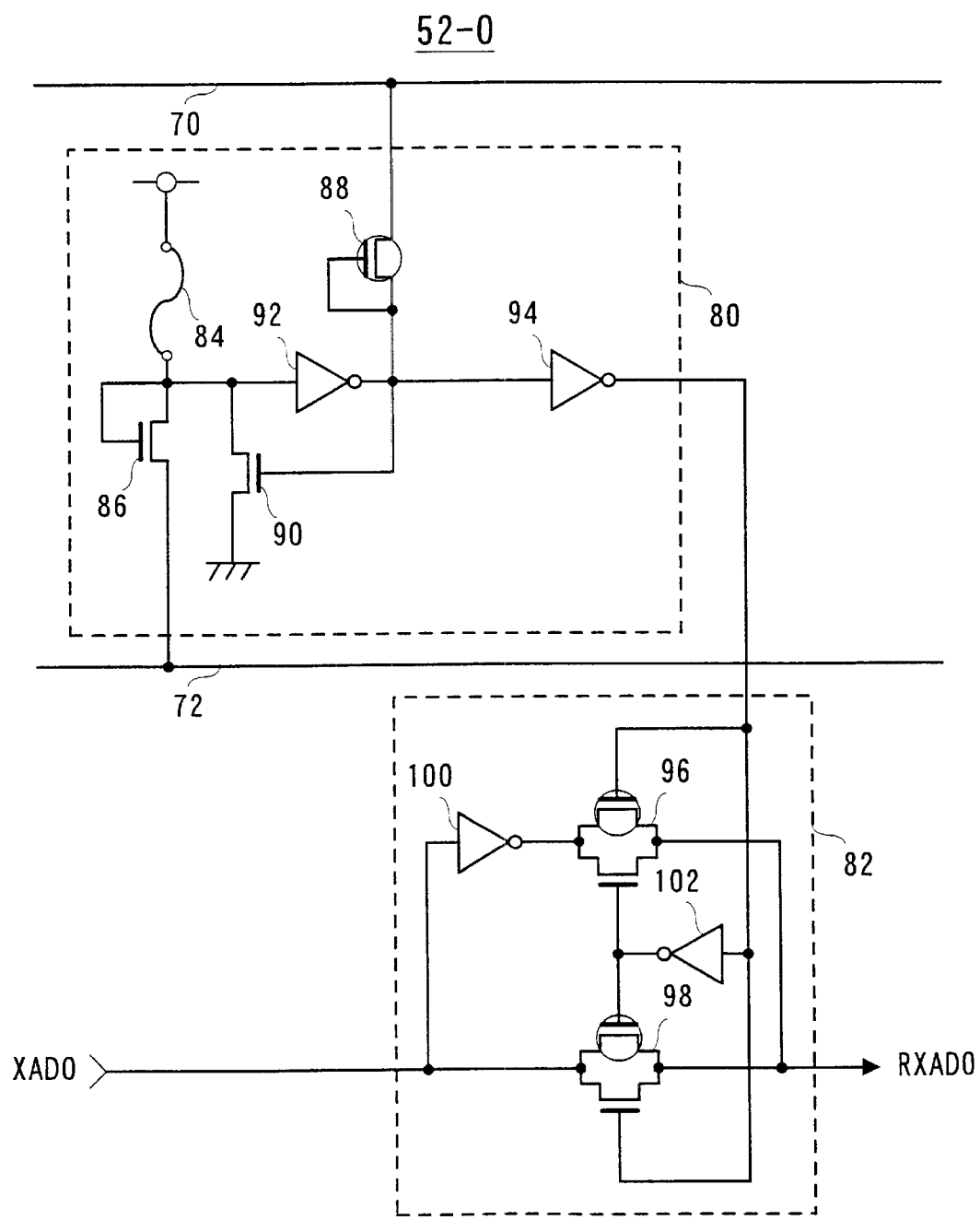
FIG. 8 is a diagram showing the circuitry structure of a fuse block according to the first embodiment of the present invention.

FIG. 8 is a diagram showing the circuitry structure of the fuse block 52-0. The rest of fuse blocks 52-1 to 52-m have the same circuitry structure.

As described in FIG. 8, the fuse block 52-0 includes a fuse section 80 and a selecting section 82.

The fuse section 80 includes a fuse element 84, N-channel type MOS transistors 86 and 90, a P-channel type MOS transistor 88 and inverters 92 and 94.

The fuse element 84 is made of polysilicon, etc., for example. A source voltage (VDD) is supplied to one end of the fuse element 84. The other end of the fuse element 84 is connected to the diode-connected N-channel type MOS transistor 86, the drain of the N-channel type MOS transistor 90, and the input terminal of the inverter 92. The source of the N-channel type MOS transistor 86 is connected to the output line 72.

The fuse element 84 can be fused during the processes of manufacturing the semiconductor memory device 10, upon radiation of a laser beam or application of a large current, for example. The fuse block 52-0 outputs the internal row address XAD0 as the redundant address signal RXAD0 as is, unless the fuse element 84 is disconnected therefrom. On the contrary, if the fuse element 84 is disconnected therefrom, the fuse block 52-0 outputs a signal, wherein the internal row address XAD0 has been inverted, as the redundant address signal RXAD0.

The P-channel type MOS transistor 88 is diode-connected. The gate electrode and drain of the P-channel type MOS transistor 88 are connected to the gate electrode of the N-channel type MOS transistor 90, the output terminal of the inverter 92 and the input terminal of the inverter 94. The source of the P-channel type MOS transistor 88 is connected to the output line 70.

The source of the N-channel type MOS transistor 90 is connected to ground (GND).

The inverter 94 is connected to the selecting section 82, and supplies the selecting section 82 with a signal for determining whether the internal row address XAD0 is to be inverted or not.

The selecting section 82 includes transfer gates 96 and 98 and inverters 100 and 102.

The transfer gates 96 and 98 operate in a manner complementing with each other, in accordance with a signal supplied from the inverter 94. That is, when electricity is conducted to either one of the transfer gates 96 and 98, no electricity is conducted to the other one of them. In more particular, if the signal sent from the inverter 94 is at a low level, electricity is conducted to the transfer gate 96, whereas no electricity is conducted to the transfer gate 98. If electricity is conducted to the transfer gate 96, the fuse block 52-0 outputs, as the redundant address signal RXAD0, the internal row address XAD0 which the inverter 100 has inverted.

On the other hand, if the signal sent from the inverter 94 is at a high level, no electricity is conducted to the transfer gate 96, whereas electricity is conducted to the transfer gate 98. If the transfer gate 98 is electrically conducted, the fuse block 52-0 outputs the internal address XAD0 as the redundant address signal RXAD0 as is.

Operations of the redundant programmable circuit 28 will now be described.

The redundant programmable circuit 28 includes the plurality of programmable circuits 40-0 to 40-n. Each of the plurality of programmable circuits 40-0 to 40-n includes a current controller 50.

In the current controller 50, the gate electrodes of the P-channel type MOS transistors 58 and 60 are commonly connected to the drain of the P-channel type MOS transistor 60. The drain voltage of the P-channel type MOS transistor 60 is a voltage whose voltage value is lower by a threshold voltage value Vtp of the P-channel type MOS transistor 60, as compared with a source voltage (VDD). Thus, the currents flowing to and through the P-channel type MOS transistors 58 and 60 have substantially the same current value.

In the current controller 50, the gate electrodes of the respective N-channel type MOS transistors 62 and 64 are commonly connected to the drain of the N-channel type MOS transistor 62. The drain voltage of the N-channel type MOS transistor 62 is a voltage whose voltage value is higher by a threshold voltage value Vtn of the N-channel type MOS transistor 62, as compared to a ground voltage (GND). Hence, the currents flowing to and through the N-channel type MOS transistors 62 and 64 have substantially the same current value. Accordingly, those currents flowing to and through the transistors 58 to 64 have substantially the same current value.

The gate electrode of the P-channel type MOS transistor 66 is connected to the drain of the P-channel type MOS transistor 60. The current flowing to and through the P-channel type MOS transistor 66, i.e., the current supplied to the output line 70, is in proportion to the currents flowing to and through the transistors 58 to 64. More specifically, if the dimensions (a ratio of the length to width of the channel) of the P-channel type MOS transistor 66 are equal to those of the P-channel type MOS transistors 58 and 60, the current flowing to and through the P-channel type MOS transistor 66 is equal to the currents flowing to and through the P-channel type MOS transistors 58 and 60. If the dimensions of the P-channel type MOS transistor 66 are twice as large as those of the P-channel type MOS transistors 58 and 60, the current flowing to and through the P-channel type MOS transistor 66 is twice as high as those flowing to and through the P-channel type MOS transistors 58 and 60.

The gate electrode of the N-channel type MOS transistor 68 is connected to the drain of the N-channel type MOS transistor 62. The current flowing to and through the N-channel type MOS transistor 68, i.e. the current which is discharged from the fuse blocks 52-0 to 52-m by the output line 72, is in proportion to the current flowing to and through the transistors 58 and 64.

Since the transistors 58 to 64 operate substantially in a range around the threshold voltage value, very little current flows therethrough. The amount of current flowing through the transistors 58 to 64 is adjustable based on the gate length or the transistor size W of the transistors 58 to 64. For example, the amount of current flowing through the transistors 58 to 64 is adjusted to approximately 100 nA.

The output lines 70 and 72 supplies a current for making the fuse section 80 operate.

In the case where the fuse element 84 is disconnected inside the fuse section 80, no source voltage (VDD) is supplied to the input terminal of the inverter 92. The diode-connected N-channel type MOS transistor 86 discharges from an electric charge at the input terminal of the inverter 92. Hence, the inverter 92 outputs a high level voltage. Because the input terminal of the inverter 92 is connected to the diode-connected N-channel type MOS transistor 86, the input voltage of the inverter 92 has not influence on the output line 72. Because the output terminal of the inverter 92 is connected to the diode-connected P-channel type MOS transistor 88, the output voltage of the inverter 92 has not influence on the output line 70. Since the inverter 92 outputs a high level voltage, the inverter 94 outputs a low level voltage. The N-channel type MOS transistor 90 retains to be in an ON state. The output voltage of the inverter 94 is supplied to the selecting section 82. The output voltage of the inverter 94 is at a low level, electricity is conducted to the transfer gate 96 and no electricity is conducted to the transfer gate 98 in the selecting section 82. At this time, the inverter 100 outputs the redundant address signal RXAD0, wherein the internal row address XAD0 has been inverted.

Unexamined Japanese Patent Application KOKAI Publications Nos. H5-74190 and H5-206752 disclose a technique for stabilizing a logical level of a input terminal in the state where a fuse is disconnected. In the fuse section 80 included in the redundant programmable circuit 28 according to the embodiment of the present invention, the diode-connected N-channel type MOS transistor 86 is connected to the output line 72. Thus, such a problem that the logical level is not stable does not occur in the semiconductor memory device according to the present invention.

On the contrary, in the case where the fuse element 84 is not disconnected from the fuse section 80, the input terminal of the inverter 92 receives a source voltage (VDD) through the fuse element 84. The current flowing through the diode-connected N-channel type MOS transistor 86 is controled by the N-channel type MOS transistor 68. Because the fuse blocks 52-0 to 52-m are connected parallelly to the output line 72, the current flowing from the N-channel type MOS transistor 86 to and through the output line 72 is greatly limited. If the amount of current flowing through the N-channel type MOS transistor 68 is set very small, the voltage at the input terminal of the inverter 92 is to substantially be equal to a source voltage (VDD). Thus, the inverter 92 outputs a low level voltage. At this time, a current path, along the output line 70, the P-channel type MOS transistor 88 and the transistor of the output terminal included in the inverter 92, can be formed. The amount of current flowing through this current path is controled by the current controller 50 which is connected to the output line 70. Because the inverter 92 output a low level voltage, the inverter 94 outputs a high level voltage. The N-channel type MOS transistor 90 retains to be in an OFF state. Because the output voltage of the inverter 94 is at a high level, no electricity is conducted to the transfer gate 96, whereas electricity is conducted to the transfer gate 98 in the selecting section 82. At this time, the transfer gate 98 outputs the internal row address XAD0 as the redundant address signal RXAD0.

The redundant address signals RXAD0 to RXADm which are respectively output by the fuse blocks 52-0 to 52-m are sent to the coincidence detection circuit 54. The coincidence detection circuit 54 makes a detection signal R0 be at a high level, in the case where the redundant address signals RXAD0 to RXADm are all at a high level (or at a low level). The detection signal R0 is sent to the redundant word driver 30. The redundant word driver 30 selects a redundant word line RW corresponding to the detection signal R0, thereby to read data from the memory cell included in the redundant memory cell array 26, or to write data in the memory cell. The redundant word driver 30 makes the detection signal R0 be at a high level, thereby to prohibit any operations of the word driver 32. Thus, the redundant word line RW and the word line W are impossibly activated at the same time.

As explained above, in the fuse blocks 52-0 to 52-m respectively included in the programmable circuits 40-0 to 40-n, the operational current of the fuse section 80 is controled by the current controller 50. The fuse section 80 includes a single fuse element 84 only, thus the chip area thereof can be made small.

The current controller 50 which is parallelly connected to the fuse blocks 52-0 to 52m controls the current amount of the output lines 70 and 72, thus the number of bits forming the internal row address XAD has no influence on the power to be consumed by the programmable circuits 40-0 to 40-n.

A redundant programmable circuit according to the second embodiment of this invention will now be explained.

The redundant programmable circuit according to the second embodiment of this invention includes programmable circuits 110-0 to 110-n, in place of the programmable circuits 40-0 to 40-n included in the redundant programmable circuit 28 according to the above first embodiment.

Figure 9:
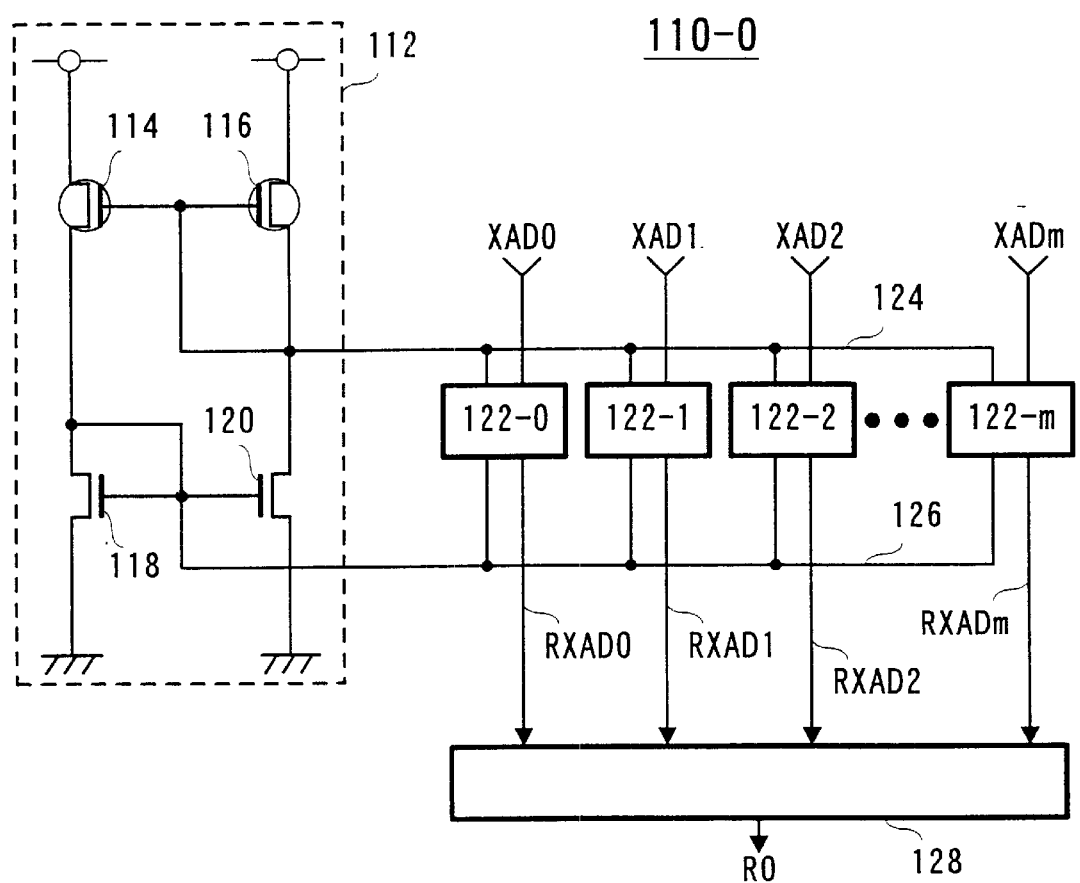
FIG. 9 is a diagram showing the structure of a programmable circuit according to the second embodiment of the present invention.

FIG. 9 is a diagram showing the circuitry structure of the programmable circuit 110-0. The rest of program circuits 110-1 to 110-n have the same circuitry structure.

As shown in FIG. 9, the program circuit 110-0 includes a current controller 112, a plurality of fuse blocks 122-0 to 122-m, and a coincidence detection circuit 128.

The current controller 112 is a circuit having the current mirror structure. The current controller 112 includes P-channel type MOS transistors 114 and 116, and N-channel type MOS transistors 118 and 120.

The gate electrode of the P-channel type MOS transistor 114 and the gate electrode of the P-channel type MOS transistor 116 are commonly connected to the drain of the P-channel type MOS transistor 116. The gate electrode of the N-channel type MOS transistor 118 and the gate electrode of the N-channel type MOS transistor 120 are commonly connected to the drain of the N-channel type MOS transistor 118. An output line 124 connected to the plurality of fuse blocks 122-0 to 122-m is connected to the gate electrodes of the respective P-channel type MOS transistors 114 and 116 and the drain of the P-channel type MOS transistor 116. An output line 126 connected to the plurality of fuse blocks 122-0 to 122-m is connected to the gate electrodes of the respective N5 channel type MOS transistors 118 and 120 and the drain of the N-channel type MOS transistor 118. A source voltage (VDD) is supplied to the sources of the P-channel type MOS transistors 114 and 116. The sources of the N-channel type MOS transistors 118 and 120 are connected to ground (GND).

The number of fuse blocks 122-0 to 122-m, which is the same as the bit number of an internal row address XAD, are prepared in each one of an "n+1" number of programmable circuits 110-0 to 110-n. Each of the plurality of fuse blocks 122-0 to 122-m receives a corresponding one bit of bits XAD0 to XADm of the internal row address XAD. The plurality of fuse blocks 122-0 to 122-m respectively output redundant address signals RXAD0 to RXADm, and send the signals to the coincidence detection circuit 128.

Figure 10:
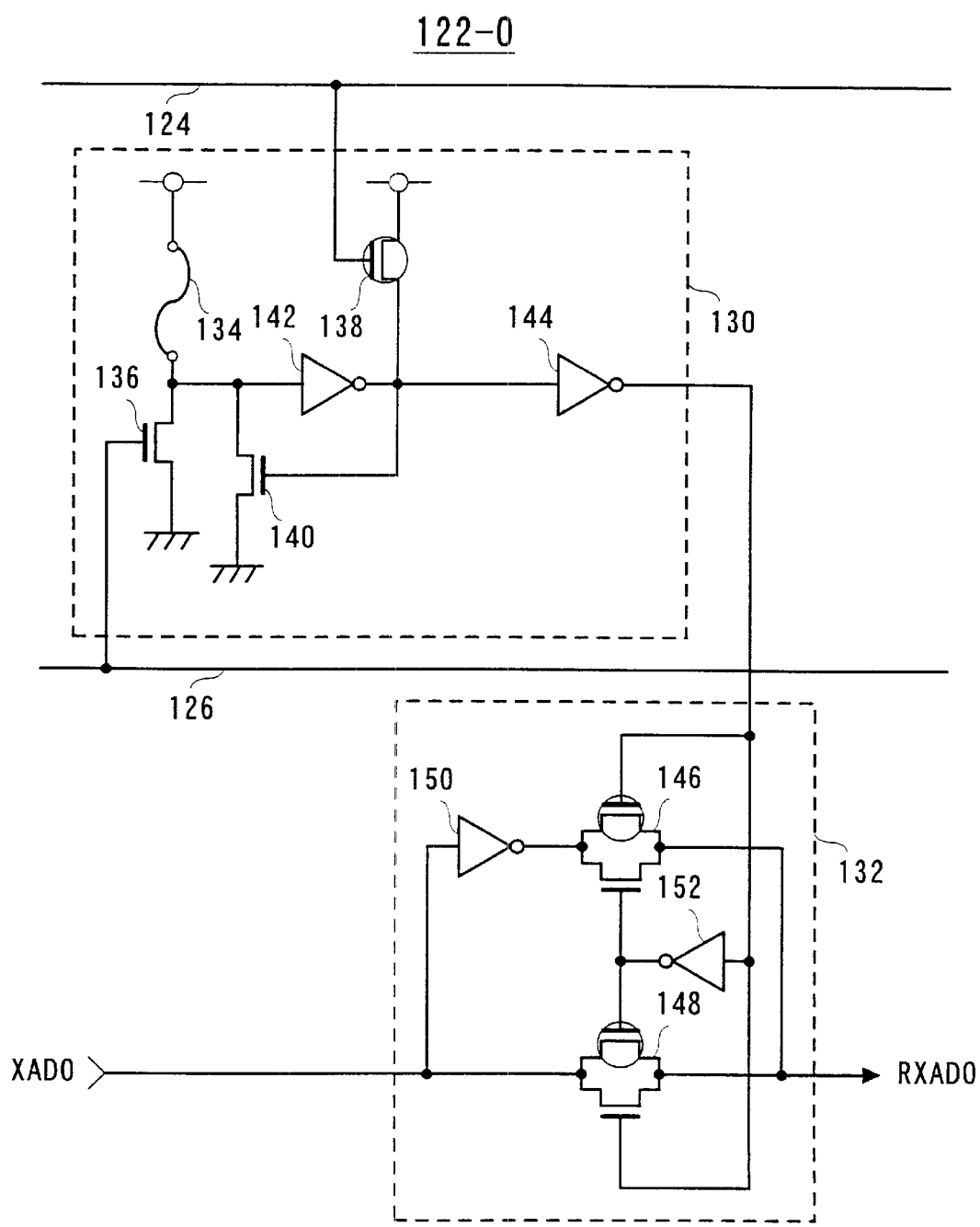
FIG. 10 is a diagram showing the circuitry structure of a fuse block according to the second embodiment of the present invention.

FIG. 10 is a diagram showing the circuitry structure of the fuse block 122-0. The rest of fuse blocks 122-1 to 122-m have the same circuitry structure.

As illustrated in FIG. 10, the fuse block 122-0 includes a fuse section 130 and a selecting section 132.

The fuse section 130 includes a fuse element 134, N-channel type MOS transistors 136 and 140, a P-channel type MOS transistor 138, and inverters 142 and 144.

The gate electrode of the N-channel type MOS transistor 136 is connected to the output line 126. The source of the N-channel type MOS transistor 136 is connected to ground (GND). A voltage, wherein source voltage (VDD) is divided, is supplied to the input terminal of the inverter 142 by the N-channel type MOS transistor 136 and the fuse element 134. Any other parts of the fuse section 130 are the same as the structure of the fuse section 80 according to the first embodiment. The circuitry structure of the selecting section 132 is the same as that of the selecting section 82 according to the first embodiment.

Operations of the programmable circuits 110-0 to 110-n will now be described.

The programmable circuits 110-0 to 110-n operate substantially in the same manner as the programmable circuit 40-0 according to the first embodiment.

In each of the programmable circuits 110-0 to 110-n, the operations of the N-channel type MOS transistor 136 prepared in each of the fuse blocks 122-0 to 122-m are controled directly by the output line 126. In each of the programmable circuits 110-0 to 100-n, the operations of the P-channel type MOS transistor 138 prepared in each of the fuse blocks 122-0 to 122m are controlled directly by the output line 124. The current flowing to and through the N-channel type MOS transistor 136 and the current flowing to and through the P-channel type MOS transistor 138 are in proportion to the current flowing to and through the transistors 114 to 120 forming the current controller 112. Thus, the amount of currents flowing through the programmable circuits 110-0 to 110-n is in proportion to an "m+1" number of fuse blocks 122-0 to 122-m, i.e., the bit number "m+1" of the internal row addresses XAD0 to XADm. In this case, the gate length L or the transistor size W of the transistors 114 to 122 are so set that the amount of current flowing through the transistors 114 to 120 forming the current controller 112 is small. This achieves a reduction in the power to be consumed by the semiconductor memory device. Alternatively, the dimensions of the N-channel type MOS transistor 136 and P-channel type MOS transistor 138 are set small, thereby achieving a reduction in the power to be consumed. The current controller 112 is capable of supplying a constant amount of current to each one of the fuse blocks 122-0 to 122-m, regardless of whether the fuse element 134 included in each of the fuse blocks 122-0 to 122-m is disconnected therefrom or not.

The present invention is not limited to the above-described embodiments, and various changes and modifications can be made.

For example, it is not necessary that each current controller 50 or 112 is prepared in each of the programmable circuits 40-0 to 40-n or in 110-0 to 110-n. Thus, one current controller 50 may be common to two programmable circuits 40-0 and 40-1. Alternatively, each of the programmable circuits 40-0 to 40-n or 110-0 to 110-n may include a plurality of current controller 50 or 112.

In the above-described embodiments, explanations have been made to the case where the redundant programmable circuit 28 is prepared in the row. However, the redundant programmable circuit 28 may be prepared in the column. In this case, it is preferred that the redundant memory cell array be prepared in the column. The internal column address YAD is supplied to the redundant programmable circuit in the column as well as to the column decoder 20.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-178468 filed on Jun. 24, 1999 and including specification, claims, drawings and summary. The disclosure of the above Japanese Patent Application is incorporated herein by reference in its entirety.

What is claimed is:

1. A redundant programmable circuit comprising:
   a control signal generation circuit which has a fuse and generates a control signal corresponding to whether the fuse is disconnected;
   a first transfer gate which receives an address signal and outputs an inverted address signal in accordance with the control signal when the fuse is disconnected; and
   a second transfer gate which receives an address signal and outputs a non-inverted address signal in accordance with the control signal when the fuse is connected; and
   a current controller which is connected to said control signal generation circuit, and controls an operational current to a given value, and wherein said control signal generation circuit includes:
   a first transistor which is connected between said fuse and said current controller; and
   second and third transistors both of which are connected to said current controller.

2. A redundant programmable circuit comprising:
   a plurality of signal output circuits which are connected in parallel between and to a single pair of connection lines, and each of which receives a binary signal corresponding to a plurality of bits sent from an external device, and also each of which outputs an inverted or non-inverted binary signal;
   a coincidence detection circuit which generates a detection signal representing that the binary signals respectively output by said plurality of signal output circuits are at a predetermined signal level; and
   a current controller which controls an amount of current flowing to and through the pair of connection lines to a given value for the continuing operation of said plurality of signal output circuits.

3. The redundant programmable circuit according to claim 2, wherein each of said plurality of signal output circuits includes:
   a transistor and a fuse element which are connected in series between one of the pair of connection lines and a power source;
   a voltage retaining circuit which receives a voltage at a connection point of said fuse element and said transistor, and outputs a signal at a given voltage level; and
   a transmission circuit which outputs the received binary signal in an inverted or non-inverted form, in accordance with a voltage level of the signal which said voltage retaining circuit outputs.

4. The redundant programmable circuit according to claim 3, wherein said voltage retaining circuit outputs a signal at a given voltage level, which is determined in accordance with whether said fuse element is disconnected therefrom.

5. The redundant programmable circuit according to claim 2, wherein the binary signal which each of said plurality of signal output circuits receives is a signal representing an address of a memory cell included in a semiconductor memory device.

6. The redundant programmable circuit according to claim 2, wherein:
   said current controller includes a current mirror circuit; and
   said current controller regulates an amount of current flowing through the pair of connection lines, based on an amount of current flowing through said current mirror circuit.

7. A redundant programmable circuit comprising:
   a plurality of signal output circuits, which are connected in parallel between and to a single pair of connection lines, and each of which receives a binary signal corresponding to a plurality of bits sent from an external device, and also each of which outputs a binary signal in an inverted or non-inverted form;
   a coincidence detection circuit which generates a detection signal representing that the binary signal output by each of said plurality of signal output circuits is at a given signal level; and
   a current controller which is connected to the pair of connection lines and which controls an amount of current flowing to said plurality of signal output circuits to a given value for the continuing operation of said plurality of signal output circuits.

8. The redundant programmable circuit according to claim 7, wherein:
   said current controller has a current mirror structure; and
   each of said plurality of signal output circuits includes a plurality of transistors which are current-mirror-connected with said current controller via the pair of connection 5 lines.

9. The redundant programmable circuit according to claim 7, wherein each of said plurality of signal output circuits includes:
   a transistor whose gate electrode is connected to one of the pair of connection lines;
   a fuse element which is connected in series with said transistor;
   a voltage retaining circuit which receives a voltage at a connection point of said transistor and said fuse element, and outputs a signal at a given voltage level; and
   a transmission circuit which outputs the received binary signal in an inverted or non-inverted form, in accordance with a voltage level of a signal which said voltage retaining circuit outputs.

10. The redundant programmable circuit according to claim 8, wherein said voltage retaining circuit outputs a signal at a given voltage level which is determined in accordance with whether said fuse element is disconnected therefrom.

11. A redundant programmable circuit comprising:
    a plurality of signal output means for receiving a binary signal corresponding to a plurality of bits sent from an external device, and for outputting a binary signal in an inverted or non-inverted form;
    means for generating a detection signal representing that the binary signal output by said plurality of signal output means is at a given signal level;
    a single pair of parallel connection means for connecting said plurality of signal output means;
    current controlling means for controlling an amount of current flowing through said plurality of signal output means to a given value for the continuing operation of said plurality of signal output means, said single pair of parallel connection means connecting said plurality of signal output means to said current controlling means, said plurality of signal output means being connected in parallel between and to said single pair of parallel connection means.

12. A semiconductor memory device comprising:

a memory cell array;

a redundant memory cell array;

a first driving circuit, which receives an address signal, for accessing a memory cell included in said memory cell array;

a redundant programmable circuit which receives an address signal and which determines whether the received address signal is one for requesting access to a defective memory cell; and a second driving circuit for accessing a memory cell included in said redundant memory cell array, when said redundant programmable circuit detects a request for accessing a defective memory cell, and wherein said redundant programmable circuit receives a binary signal forming an address signal corresponding to a plurality of bits and includes:

a plurality of signal output circuits each of which outputs a binary signal in an inverted or non-inverted form, a coincidence detection circuit which generates a detection signal representing that the binary signal output by each of the plurality of signal output circuits is at a given signal level, and a current controller which controls an amount of current flowing through the plurality of signal output circuits to a given value for the continuing operation of the plurality of signal output circuits, the current flowing through the plurality of signal output circuits also flowing through a single pair of connection lines connecting the current controller and the plurality of signal output circuits, the plurality of signal output circuits being connected in parallel between and to the single pair of connection lines.

13. The semiconductor memory device according to claim 12, wherein each of said plurality of signal output circuits includes:

a transistor and a fuse element which are connected in series between a power source and the connection lines connected to said current controller;

a voltage retaining circuit which receives a voltage at a connection point of said transistor and said fuse element, so as to output a signal at a given voltage level; and a transmission circuit which outputs the received binary signal in an inverted or non-inverted form, in accordance with a voltage level of the signal output by said voltage retaining circuit.

14. The semiconductor memory device according to claim 13, wherein said voltage retaining circuit outputs a signal at a given voltage level which is determined in accordance with whether said fuse element is disconnected.

15. The semiconductor memory device according to claim 12, wherein:

said current controller includes a current mirror circuit; and said current controller regulates an amount of current flowing through said plurality of signal output circuits, based on an amount of current flowing to said current mirror circuit.

* * * * *